United States Patent
Manz et al.

(10) Patent No.: US 7,164,201 B2
(45) Date of Patent: Jan. 16, 2007

(54) SEMICONDUCTOR MODULE WITH SCALABLE CONSTRUCTION

(75) Inventors: Yvonne Manz, Weisendorf (DE); Jürgen Steger, Hilpoltstein (DE); Thomas Stockmeier, Nürnberg (DE)

(73) Assignee: Semikron Elektronik & Co. KG, Nürnberg (DE)

( * ) Notice: Subject to any disclaimer, the term of this patent is extended or adjusted under 35 U.S.C. 154(b) by 0 days.

(21) Appl. No.: 10/897,720

(22) Filed: Jul. 23, 2004

(65) Prior Publication Data
US 2005/0035439 A1 Feb. 17, 2005

(30) Foreign Application Priority Data
Jul. 23, 2003 (DE) ............... 103 33 328

(51) Int. Cl.
*H01L 23/34* (2006.01)
(52) U.S. Cl. ............ 257/724; 257/684; 257/690; 257/E25.03
(58) Field of Classification Search .......... 257/500, 257/501, 701, 702, 703, E23.08, E25.03, 257/724
See application file for complete search history.

(56) References Cited

U.S. PATENT DOCUMENTS
6,835,994 B1 * 12/2004 Kistner et al. .............. 257/501

FOREIGN PATENT DOCUMENTS
DE 103 16 355 B3 7/2004

* cited by examiner

*Primary Examiner*—Tu-Tu Ho
(74) *Attorney, Agent, or Firm*—Cohen Pontani Lieberman & Pavane LLP

(57) ABSTRACT

A power semiconductor module with a scalable construction, having a base plate or intended for direct mounting on a heat sink. The module has a framelike housing, a cover, terminal elements, extending to the outside of the housing for load contacts and auxiliary contacts. The module having at least two electrically insulating substrates disposed inside the housing, which in turn each comprise one insulating body and a plurality of metal conducting tracks, located on the first main face of the insulating body, which first main face is remote from the base plate or the heat sink. The metal connecting tracks are electrically insulated from one another, and power semiconductor components are located on and electrically connected to these connecting tracks. The substrates (50) are identical, and electrically connected to one another, and have the same type and number of power semiconductor components disposed thereon.

5 Claims, 3 Drawing Sheets

SEMICONDUCTOR MODULE WITH SCALABLE CONSTRUCTION

BACKGROUND OF THE INVENTION

1. Field of the Invention

The invention is directed to a power semiconductor module, and, more particularly, to a power semiconductor module with a scalable construction.

2. Description of the Related Art

Power semiconductor modules that are the point of departure for the present invention are known for instance from German Patent Disclosure DE 103 16 355. Such power semiconductor modules have defined voltage and power classes. As examples, the voltage classes of 600V, 1200V and 1700V are known. In the same way, various power classes are known. To enable covering a broad range of uses, power semiconductor modules corresponding to these classes are thus offered. To make it possible to assure rational production, given the many types involved, power semiconductor modules are offered in an identical external shape with identical terminal elements for different classes, for both voltage and power classes. Depending on the classes involved, they differ in the number and type of power semiconductor components contained in them, in the design of the substrate, and in further functionalities, such as integrated sensor system components.

The prior art is defined by power semiconductor components that include a different number of substrates for different power classes. These substrates differ from one another, for instance in whether conductor tracks for further functionalities, such as sensor system components, are disposed on them, whether a sensor system component is disposed on the substrate, how the internal connections to external terminals are disposed, or how the substrates are connected to one another internally. Power semiconductor modules for various classes, while having a similar external construction, differ significantly in their internal construction. This is disadvantageous to automated production, since for both different power classes and different voltage classes, different substrates are employed.

SUMMARY OF THE INVENTION

The inventive module comprises a housing with a base plate and at least one electrically insulating substrate disposed therein. This substrate in turn comprises an insulating body with a plurality of metal connecting tracks located thereon and insulated from one another, and power semiconductor components located on the connecting tracks and connected thereto by appropriate circuitry. Advantageously, the substrate on its underside has a two-dimensional metal layer, comparable to the connecting tracks. Such power semiconductor modules also have terminal elements for load contacts and auxiliary contacts.

It is therefore an object of the present invention to present a power semiconductor module which is scalable in a simple way, so that power semiconductor modules of different power levels can be constructed with many identical components.

The fundamental concept of the invention is based on a power semiconductor module with a base plate or for direct mounting on a heat sink, as in the prior art, comprising a framelike housing with at least one electrically insulating substrate disposed in it. This substrate in turn comprises an insulating body with a plurality of metal connecting tracks, located on its first main face and insulated from one another, as well as preferably a two-dimensional metal layer disposed on its second main face. A plurality of power semiconductor components are disposed on the connecting tracks of the first main face and connected by appropriate circuitry to these connecting tracks. The power semiconductor module also has terminal elements, leading to the outside, for load contacts and auxiliary contacts.

Depending on the power class, the power semiconductor module of the invention has a plurality of identical substrates, with the same disposition of the power semiconductor components. Moreover, each substrate has further conductor tracks for the disposition of at least one sensor system component, and a sensor system component is disposed on at least one substrate.

An advantage of this embodiment of the inventive power semiconductor module is that because of the completely identical substrates and the assembly with power semiconductor components, the module may be easily and conveniently produced, since for different power classes, only the number of substrates disposed in the power semiconductor module varies. Additional functionalities such as sensor system components can also be integrated easily, since the conductor tracks required for them are identically provided on each substrate. Thus, inside the power semiconductor module, the only difference is the assemblage of components, but not the type or shape of the substrates within the module. The terminal faces for connecting elements for the internal and external connection of the load and auxiliary terminals are thus likewise identical on all the substrates.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings.

The invention is described in further detail below in terms of exemplary embodiments in conjunction with FIGS. 1 through 4.

DETAILED DESCRIPTION OF THE PRESENTLY PREFERRED EMBODIMENTS

Figure 1:
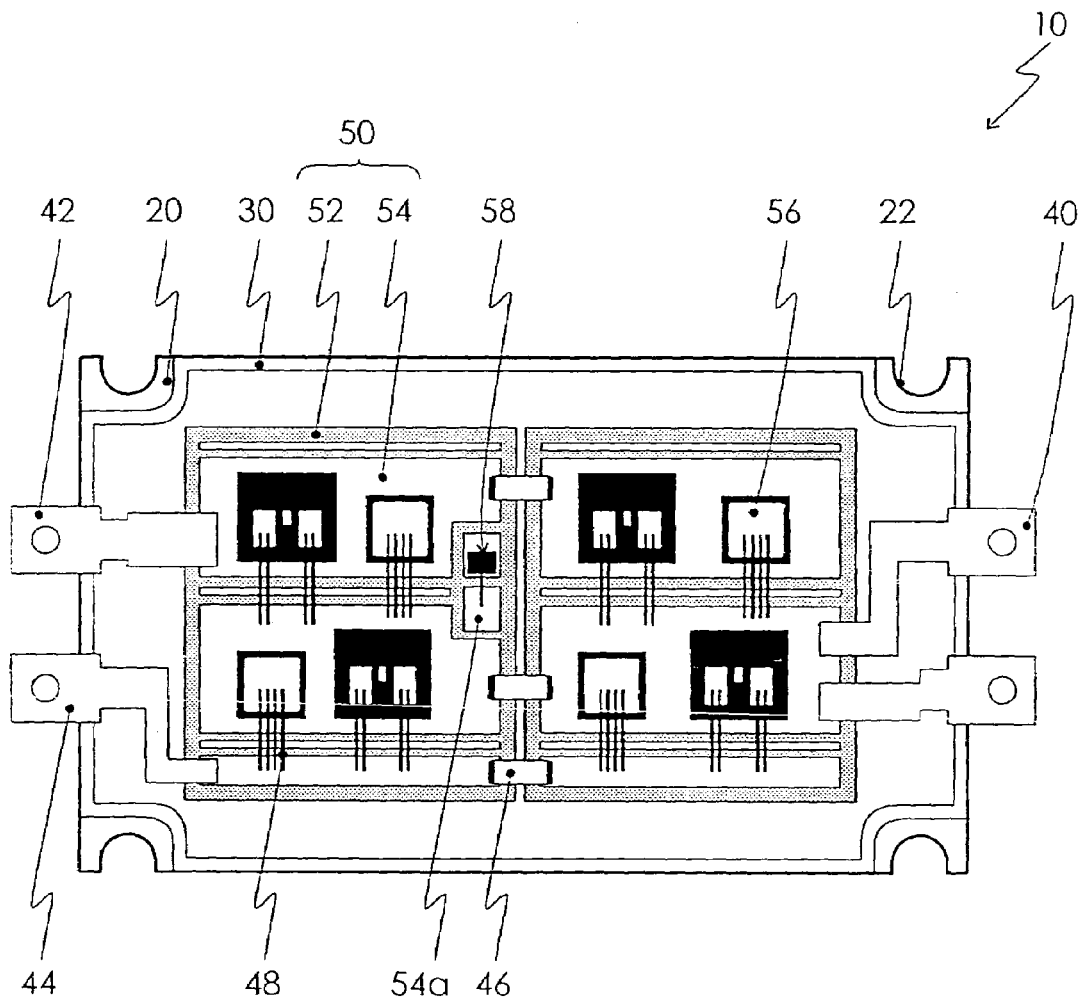
FIG. 1 shows a power semiconductor module of the prior art in plan view.

FIG. 1 shows a power semiconductor module of the prior art in plan view. A power semiconductor module 10 is shown, comprising a base plate 20, for mounting on a heat sink. For that purpose, this base plate 20 has one recess 22 in the vicinity of each of its corners. The module further comprises a framelike housing 30 as well as two electrically insulating substrates 50. Each substrate in turn comprises an insulating body 52, with a plurality of metal connecting tracks 54 insulated from one another and located on its first main face remote from the base plate 20. On its second main face, toward the base plate, the substrate has a two-dimensional metallization of the same type as the connecting tracks of the first main face. Power semiconductor components 56, and a sensor system component 58 are disposed on connecting tracks 54, and connected thereto by appropriate circuitry using wire bond connections 48. For establishing electrical contact with the exterior of housing 30, module 10 has alternating current terminals 40, and direct current terminals 42, and 44 for the load terminals.

Connecting tracks 54 of substrates 50 are connected in part with one another and are connected with one another by the terminal elements 40 directly or by means of soldered bridges 46. For the sensor system component 58 and for its external contacting, in the prior art, one of the substrates has further conductor tracks 54a. The two conductor tracks within the power semiconductor module thus have different shapes, because of their different functionality.

Figure 2:
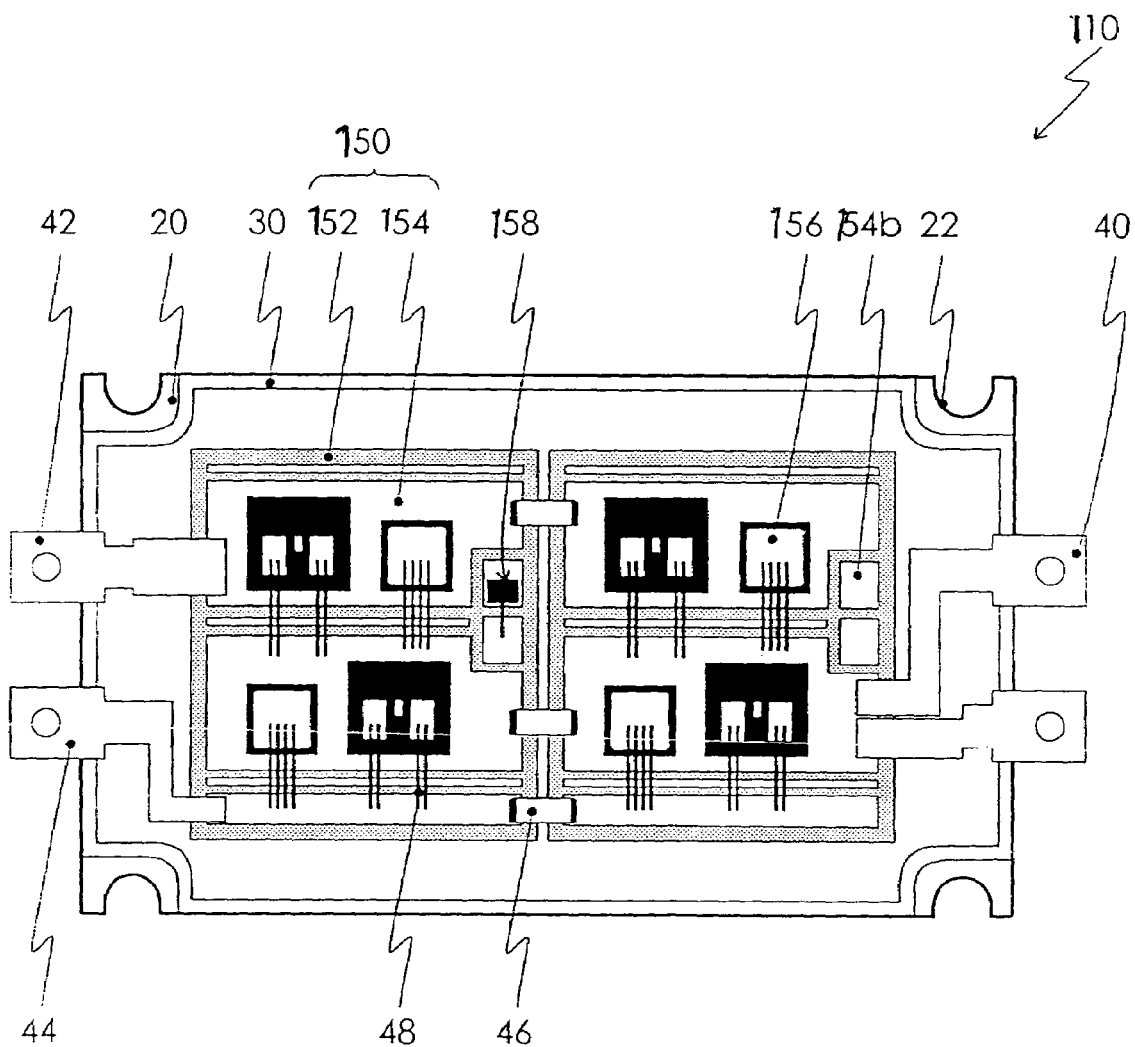
FIG. 2 shows a power semiconductor module of the present invention in plan view.
Figure 3:
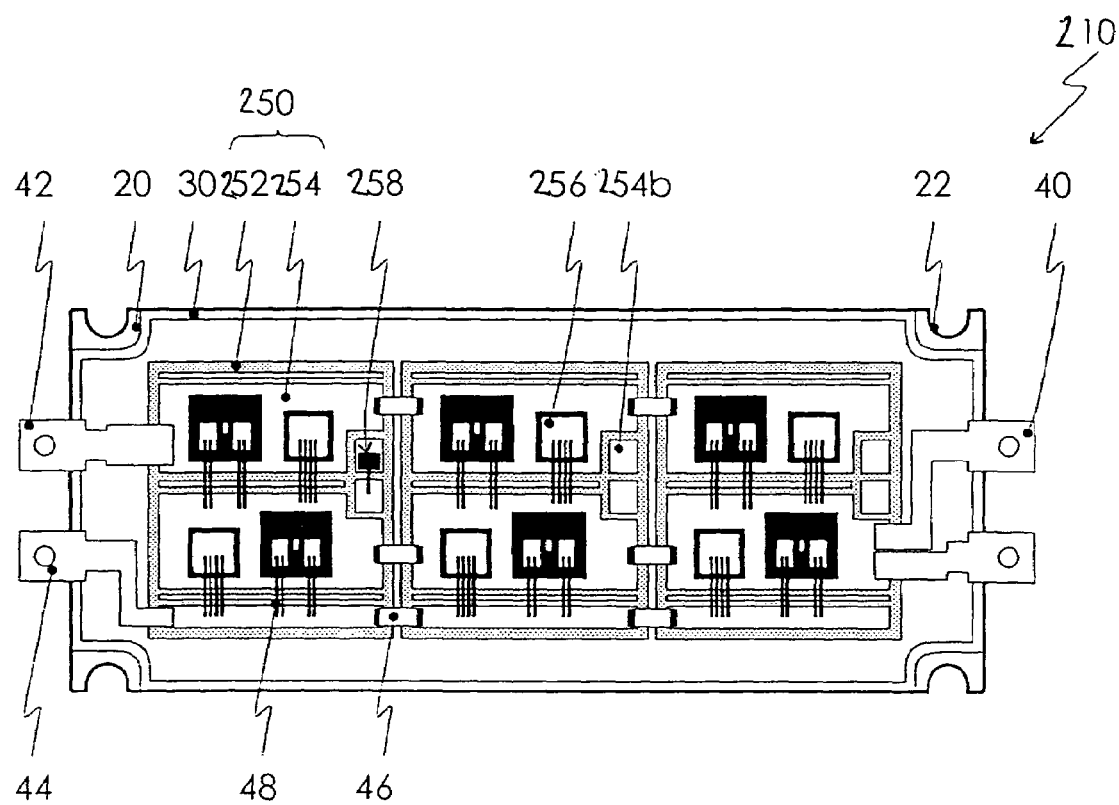
FIGS. 3 and 4 each show one further power semiconductor module of the invention, for different power classes, in plan view.
Figure 4:
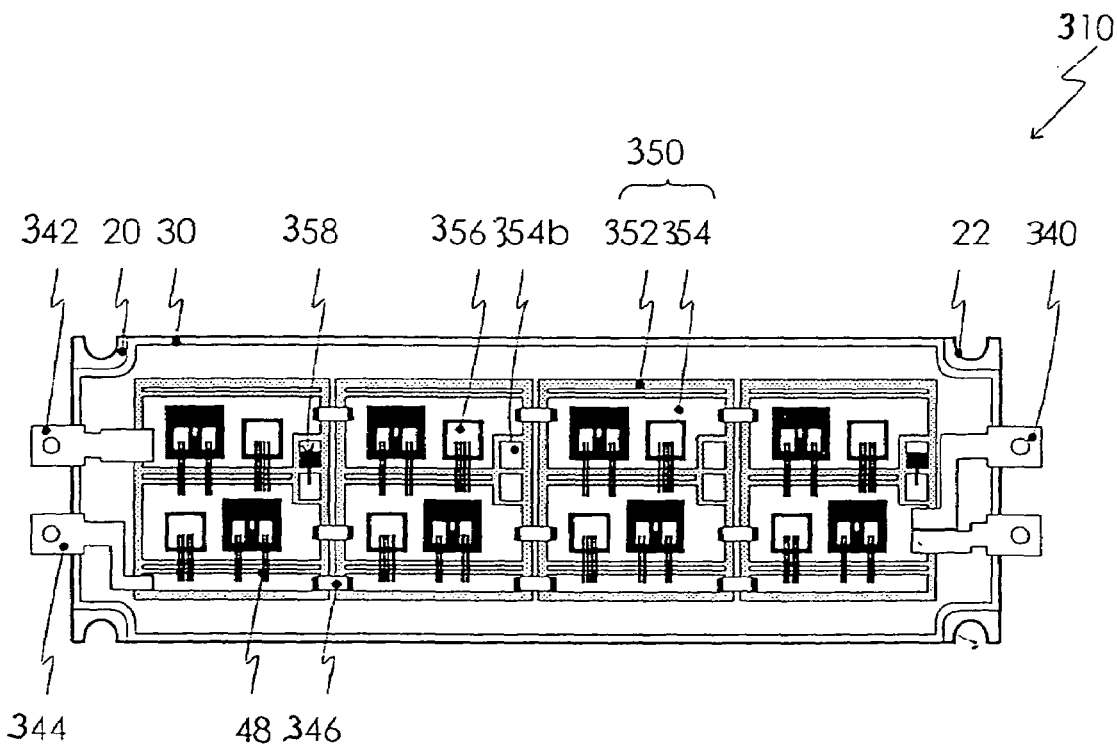

FIGS. 2 through 4 each show one power semiconductor module 110, 210, 310 of the invention in plan view. Each module differs from the prior art module 10 shown in FIG. 1 in that all the substrates 150, 250, 350 of modules 110, 210, 310, respectively, regardless of the number of substrates 150, 250, 350 which are scaled with the power class, are each embodied completely identically. Not only the size and type of the respective insulating body 152, 252, 352 but also the disposition and type of all the connecting tracks 154, 254, 354 are identical.

In addition, all the substrates 150, 250, 350 have the same number and type of power semiconductor components 156, 256, 356. The sole difference is in the further components, in this case sensor system components 158, 258, 358 with which the various substrates are equipped.

FIG. 2 shows a power semiconductor module 110 with two substrates 150. Both substrates 150 have the same number and design of connecting tracks 154, including the further connecting tracks 154b for further functionalities, such as in this case the sensor system component 158.

FIG. 3 shows a power semiconductor module 210 with 50% higher power capacity, compared to that of FIG. 2. The two differ solely in the length of the power semiconductor module 210 itself (compared to module 110 in FIG. 1), and in the number of substrates 250 disposed therein. Also, one substrate has a sensor system component 258 on the further conductor tracks 254b. The two further substrates 250 do include the conductor tracks 254, but these conductor tracks are not equipped here with components.

FIG. 4 shows a power semiconductor module 310 with twice the power capacity as that of module 110 in FIG. 2. Once again, the scaling is effected, with the same design of the external terminals 340, 342, 344 and the internal connection of the substrates 350 by soldered connectors 346, solely by way of a greater length of the module and by the disposition of further identical substrates 350. Here two substrates are equipped with sensor system components 358 on further conductor tracks 354b, while the other two substrates likewise have these further conductor tracks 354, but without any components disposed on them.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module of scalable construction, having one of a base plate and means for direct mounting of said module on a heat sink, said module comprising:
    a framelike housing;
    a cover for covering said module;
    terminal elements, extending to the exterior of said housing, including load contacts and auxiliary contacts; and
    at least two electrically insulating substrates disposed inside said housing,
    each of said substrates including an insulating body having a first main face remote from said one of said base plate and said direct mounting means and a plurality of metal connecting tracks located on said main face of said insulating body and electrically insulated from one another, and power semiconductor components located on and electrically connected to said connecting tracks;
    wherein all said substrates are identical;
    wherein all said substrates are electrically connected to one another;
    wherein the same type and number of power semiconductor components are disposed on each of said substrates; and
    wherein each substrate has a sensor system component disposed therein and at least one further conductor track with which said sensor system component is electrically connected.

2. The power semiconductor module of claim 1, wherein said base plate includes a plurality of recesses for connecting said power semiconductor module to said heat sink.

3. The power semiconductor module of claim 1, wherein said insulating body of said substrate, has a second main face, oriented toward said one of said base plate and said direct mounting means and has a two-dimensional metallization identical in type to said connecting tracks of said first main face.

4. The power semiconductor module of claim 3, wherein said one of said base plate and said means for mounting is said base plate, and said base plate includes a materially bonded connection to said metallization of said substrate which includes two-dimensional soldered connections.

5. The power semiconductor module of claim 1, wherein said substrates are connected to one another by soldered bridges.

* * * * *